(12) United States Patent
Jia et al.

(10) Patent No.: US 9,213,045 B2
(45) Date of Patent: Dec. 15, 2015

(54) ACTIVE LATERAL FORCE STICTION SELF-RECOVERY FOR MICROELECTROMECHANICAL SYSTEMS DEVICES

(71) Applicants: Kemiao Jia, Phoenix, AZ (US); Peter T. Jones, Scottsdale, AZ (US)

(72) Inventors: Kemiao Jia, Phoenix, AZ (US); Peter T. Jones, Scottsdale, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 314 days.

(21) Appl. No.: 13/901,189

(22) Filed: May 23, 2013

(65) Prior Publication Data

US 2014/0345380 A1 Nov. 27, 2014

(51) Int. Cl.
*G01P 15/125* (2006.01)
*B81C 1/00* (2006.01)
*B81B 3/00* (2006.01)

(52) U.S. Cl.
CPC ............ *G01P 15/125* (2013.01); *B81B 3/0016* (2013.01); *B81C 1/00968* (2013.01); *B81B 2201/0235* (2013.01)

(58) Field of Classification Search
CPC . G01P 15/125; G01P 15/0802; G01P 15/131; B81B 3/0016; B81B 3/0051

USPC ............ 73/514.32, 510, 493, 514.36, 514.38
See application file for complete search history.

(56) References Cited

U.S. PATENT DOCUMENTS

| | | | |
|---|---|---|---|
| 7,435,611 B2 | 10/2008 | Gupta | |
| 8,596,123 B2 * | 12/2013 | Schultz | 73/514.32 |
| 8,671,757 B2 * | 3/2014 | Reinmuth | 73/514.32 |
| 2003/0160540 A1 | 8/2003 | Miller et al. | |
| 2004/0022483 A1 | 2/2004 | Staple et al. | |
| 2004/0025591 A1 * | 2/2004 | Yoshikawa et al. | 73/514.32 |
| 2009/0107238 A1 * | 4/2009 | Guo | 73/514.32 |
| 2009/0111267 A1 | 4/2009 | Park et al. | |
| 2009/0320557 A1 * | 12/2009 | Sammoura et al. | 73/9 |
| 2012/0297879 A1 * | 11/2012 | Ullrich et al. | 73/514.32 |
| 2013/0319076 A1 * | 12/2013 | Moreau | 73/1.38 |
| 2015/0096377 A1 * | 4/2015 | Membretti et al. | 73/514.32 |

* cited by examiner

*Primary Examiner* — Helen Kwok
(74) *Attorney, Agent, or Firm* — Jonathan N. Geld (57) ABSTRACT

A mechanism for recovering from stiction-related events in a MEMS device through application of a force orthogonal to the stiction force is provided. A small force applied orthogonal to the vector of a stiction force can release the stuck proof mass easier than a force parallel to the vector of the stiction force. Example embodiments provide a vertical parallel plate or comb-fingered lateral actuator to apply the orthogonal force. Alternate embodiments provide a proof mass of a second transducer to impact a stuck MEMS actuator to release stiction.

17 Claims, 6 Drawing Sheets

ACTIVE LATERAL FORCE STICTION SELF-RECOVERY FOR MICROELECTROMECHANICAL SYSTEMS DEVICES

BACKGROUND

1. Field

This disclosure relates generally to use of microelectromechanical systems, and more specifically, to recovering from stiction events in MEMS devices through the use of an applied force orthogonal to a stiction force.

2. Related Art

Microelectromechanical systems (MEMS) devices are devices that provide moving parts with features having dimensions below 100 µm. These moving parts are formed using micro-fabrication techniques. MEMS devices have holes, cavities, channels, cantilevers, membranes, and the like. These devices are typically based on silicon materials and use a variety of techniques to form the proper physical structures and to free the mechanical structures for movement.

Stiction is a static friction force that is a recurrent problem with typical MEMS devices. While any solid objects pressing against each other without sliding require some threshold of force (stiction) to overcome static cohesion, mechanisms generating this force are different for MEMS devices. When two surfaces with areas below the micrometer range come into close proximity, the surfaces may adhere together due to electrostatic and/or Van der Waals forces. Stiction forces at this scale can also be associated with hydrogen bonding or residual contamination on the surfaces.

For MEMS devices such as accelerometers, surfaces such as over-travel stops come into close proximity or contact during use at the limits of the device design. In those situations, stiction forces can cause the MEMS device parts (e.g., a teeter-totter accelerometer mechanism) to freeze in place and become unusable. Traditional methods of avoiding such close proximity travel or contact include increasing spring constants and increasing distance between parts of the MEMS device. But avoiding stiction in this manner can decrease sensitivity of the device, and therefore decrease the utility of the MEMS device. It is therefore desirable to provide a mechanism for recovering from stiction-related interactions of MEMS devices without also decreasing sensitivity of the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for recovering from stiction-related events in a MEMS device through application of a force orthogonal to the stiction force. A small force applied orthogonal to the vector of a stiction force can release the stuck proof mass easier than a force parallel to the vector of the stiction force. Example embodiments provide a vertical parallel plate or comb-fingered lateral actuator to apply the orthogonal force. Alternate embodiments provide a proof mass of a second transducer to impact a stuck MEMS actuator to release stiction.

Figure 1:
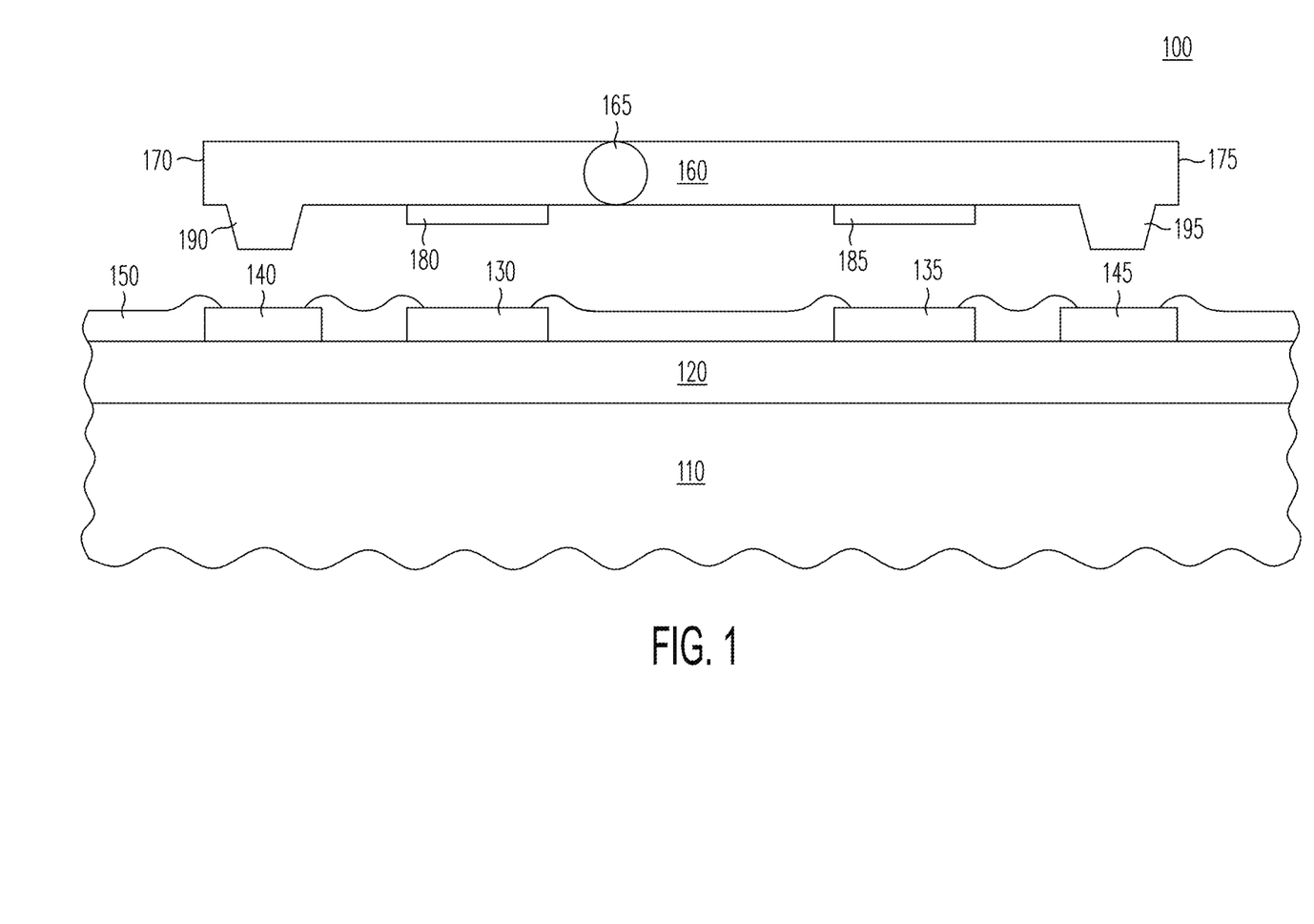
FIG. 1 is a simplified block diagram illustrating a cross section view of a teeter totter accelerometer as known in the art.

FIG. 1 is a simplified block diagram illustrating a cross section view of a teeter totter accelerometer as known in the art. Accelerometer 100 includes a substrate 110 with an insulating layer 120. Substrate 110 can be, for example, a silicon wafer and insulating layer 120 can be, for example, a silicon oxide or silicon nitride. In some cases, insulating layer 120 can be thermally grown from substrate 110 or the insulating layer can be deposited.

Fixed electrodes 130 and 135 are formed on top of insulating layer 120, along with travel stop regions 140 and 145. The layer forming fixed electrodes 130 and 135 and travel stop regions 140 and 145 is typically polysilicon and is formed using conventional techniques, including patterning the layer as desired for the application. The layer forming the fixed electrodes and travel stop regions can also be amorphous silicon, a nitride, a metal-containing material, another suitable material, and the like, or any combination thereof. A dielectric layer 150 is formed to electrically isolate the electrodes and travel stop regions from other elements of the MEMS accelerometer. Dielectric layer 150 can be formed from a variety of materials, including, for example, silicon nitride, silicon dioxide, silicon oxynitride, and the like.

A pivoting proof mass 160 is configured to move in a manner similar to that of a teeter totter upon certain accelerations. Pivoting proof mass 160 can be configured in a manner such that there is an imbalance between a side 170 of the pivoting proof mass and side 175 of the pivoting proof mass through pivot point 165. The amount of imbalance will have an effect of making the device more or less sensitive to acceleration. An electrode 180 configured on side 170 of the pivoting proof mass is associated with fixed electrode 130, while an electrode 185 on the pivoting proof mass is associated with fixed electrode 135. In addition, a travel stop 190 on side 170 of the pivoting proof mass is associated with travel stop region 140 and a travel stop 195 on side 175 of the pivoting proof mass is associated with travel stop region 145. Pivoting proof mass 160, including travel stops 190 and 195 are typically formed of polysilicon.

Electrode 180 and fixed electrode 130 form a first variable sense capacitor, while electrode 185 and fixed electrode 135 form a second variable sense capacitor. Changes in the capacitances of the first and second variable sense capacitors can be combined to provide a differential output from MEMS accelerometer 100.

Fabrication of the components of MEMS accelerometer 100 can be performed using known MEMS fabrication processes.

Figure 2:
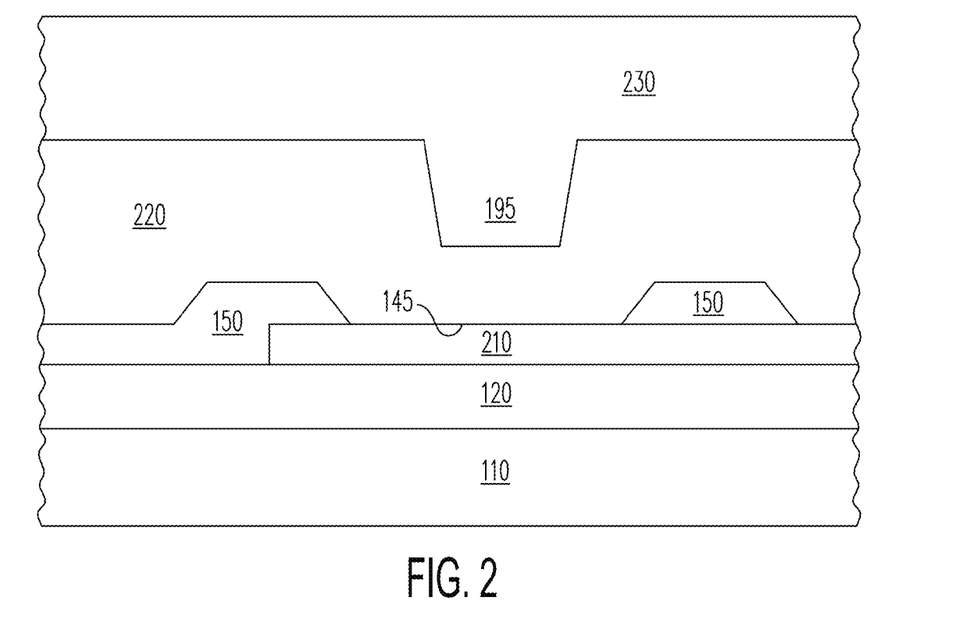
FIG. 2 is a simplified block diagram illustrating a close up of a cross section view of the travel stop region at an end of a MEMS accelerometer during a stage of fabrication.

FIG. 2 is a simplified block diagram illustrating a close up of a cross section view of the travel stop region at end 175 of MEMS accelerometer 100 during a stage of fabrication. As discussed above, a substrate 110 is provided with insulating layer 120, where substrate 110 can be a silicon wafer and insulating layer 120 can be a silicon oxide. A first polysilicon layer 210 is formed on insulating layer 120, forming, in part, travel stop region 145. Dielectric layer 150 is formed over insulating layer 120 and polysilicon layer 210, in order to, for example, prevent excessive etching of insulating layer 120. A sacrificial layer 220 is formed on top of patterned dielectric layer 150 and exposed regions of polysilicon layer 210. Sacrificial layer 220 is commonly formed using tetraethyl orthosilicate (TEOS) gas to form a sacrificial layer of silicon oxide or the sacrificial layer can be formed of phosphosilicate glass (PSG). The sacrificial layer can be patterned to form a "mold" for the next layer of the MEMS device. A second polysilicon layer 230 can be formed on the patterned sacrificial layer to form pivoting proof mass 160, including travel stop 195. The buildup of patterned layers can continue as needed for the application.

Figure 3:
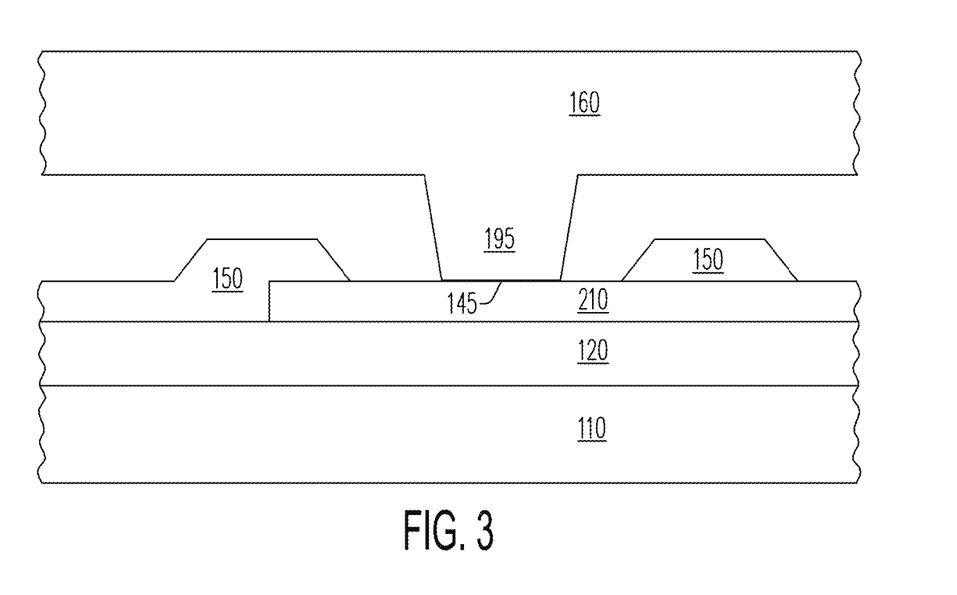
FIG. 3 is a simplified block diagram illustrating a cross-section view of the travel stop region during a stage of fabrication subsequent to that of FIG. 2.

FIG. 3 is a simplified block diagram illustrating a cross-section view of the travel stop region during a stage of fabrication subsequent to that of FIG. 2. Sacrificial layer 220 is commonly removed using an isotropic wet etch process selective to the sacrificial layer. Etching can be performed by either a vapor or a liquid phase process.

Figure 4:
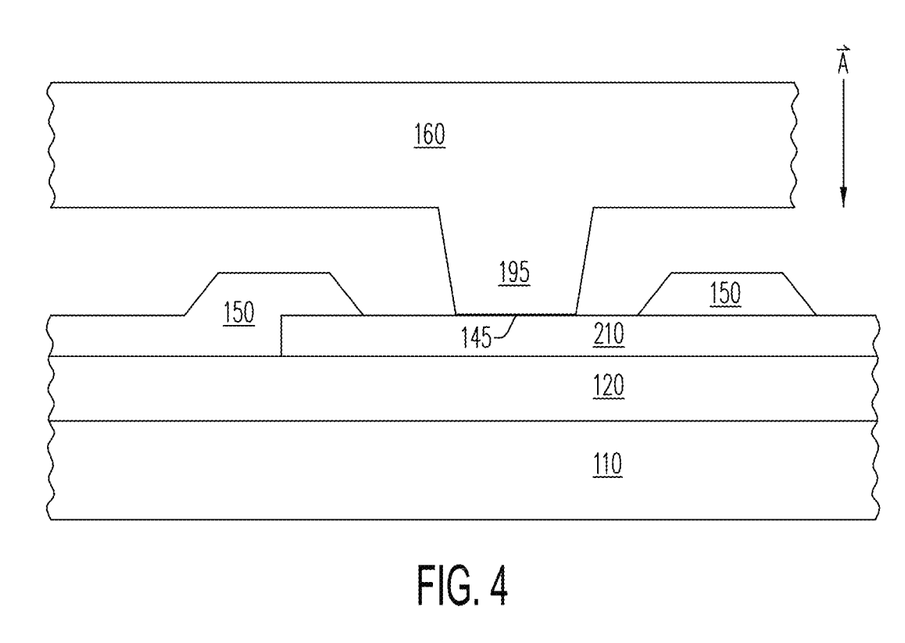
FIG. 4 is a simplified block diagram illustrating a cross-section view of the travel stop region during a use of the accelerometer.

FIG. 4 is a simplified block diagram illustrating a cross-section view of the travel stop region during a use of the accelerometer. Acceleration-related force $\vec{A}$ on pivoting proof mass 160 is sufficient to exceed the design specification for the accelerometer. This causes travel stop 195 to impact travel stop region 145, thereby preventing contact of electrode 185 to fixed electrode 135. In this case, however, stiction forces such as Van der Waals, electrostatic, and/or hydrogen bonding can cause the travel stop surface to stick to the travel stop region. Once this occurs, it can be difficult to release the pivoting proof mass and continue normal operations.

It has been determined that a stiction force can be released using a force or impulse of a significantly lower magnitude than a release force applied in a direction parallel to that of the stiction force. Embodiments of the present invention provide a mechanism by which the pivoting proof mass can be released through application of a force orthogonal to that of the stiction force holding the surface area of travel stop 195 in contact with travel stop region 145. As will discussed more fully below, the orthogonal force can be applied through use of an electrostatic actuator formed on a side of the pivoting proof mass, or through a mechanical impact with another proof mass provided in the MEMS package.

Figure 5:
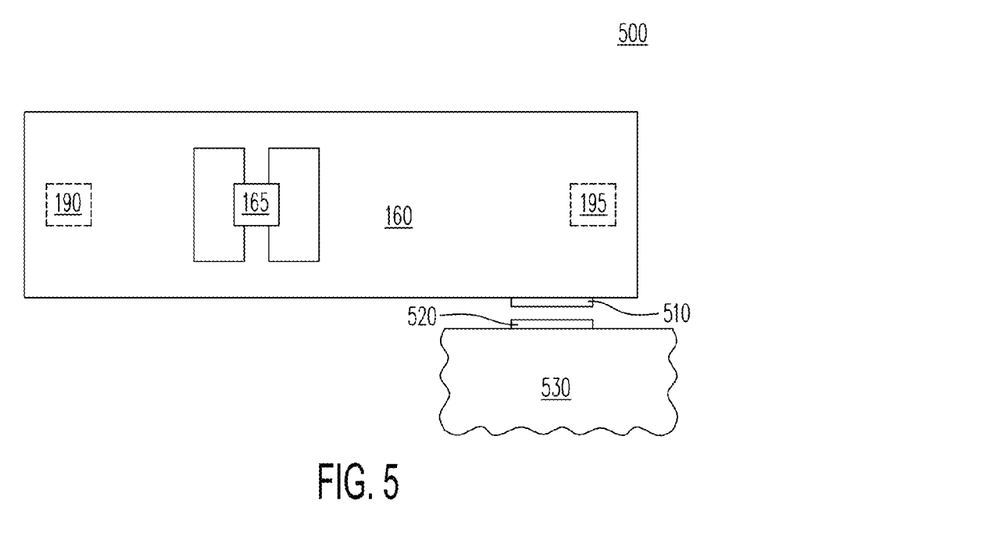
FIG. 5 is a plan view of a teeter totter accelerometer assembly 500 including a means for applying an electrostatic force orthogonal to a stiction force, in accord with one embodiment of the present invention.

FIG. 5 is a plan view of a teeter totter accelerometer assembly 500 including a means for applying an electrostatic force orthogonal to a stiction force, in accord with one embodiment of the present invention. The teeter totter accelerometer is fabricated using a process similar to that described above, resulting in a pivoting proof mass 160 that rotates through a pivot point 165. Travel stops 190 and 195 are illustrated as being below the rotating proof mass.

As discussed above, an orthogonal force to that of stiction holding a travel stop to a travel stop region can be applied to release a pivoting proof mass. An orthogonal force electrode 510 is formed on pivoting proof mass 160 in a region near a travel stop (e.g., travel stop 195). Orthogonal force electrode 510 is formed such that an electrostatic force applied through the electrode will be orthogonal to a stiction force holding travel stop 195. The electrostatic force can be applied through a fixed electrode 520. Fixed electrode 520 is formed on a surface 530 in a region proximate to electrode 510. Orthogonal force electrode 510 and fixed electrode 520 are formed using techniques known in the art of microelectromechanical systems fabrication, such as those described above.

A magnitude of an orthogonally applied force needed to release a MEMS device held in stiction can depend upon a variety of factors related to the MEMS device, including, for example, spring constant, contact area of travel stop, moisture conditions, and the like. For a particular accelerometer assembly design, analysis can be performed to determine the appropriate magnitude of orthogonally applied force for that design. That force magnitude can be used to determine the size of orthogonal force electrode 510 and fixed electrode 520, as well as the magnitude of electrostatic charge applied to the orthogonal force electrode and fixed electrode. In some cases, however, the orthogonal force magnitude may be sufficiently large as to require orthogonal force electrode 510 and fixed electrode 520 to be impractically large for the size of the pivoting proof mass.

Figure 6:
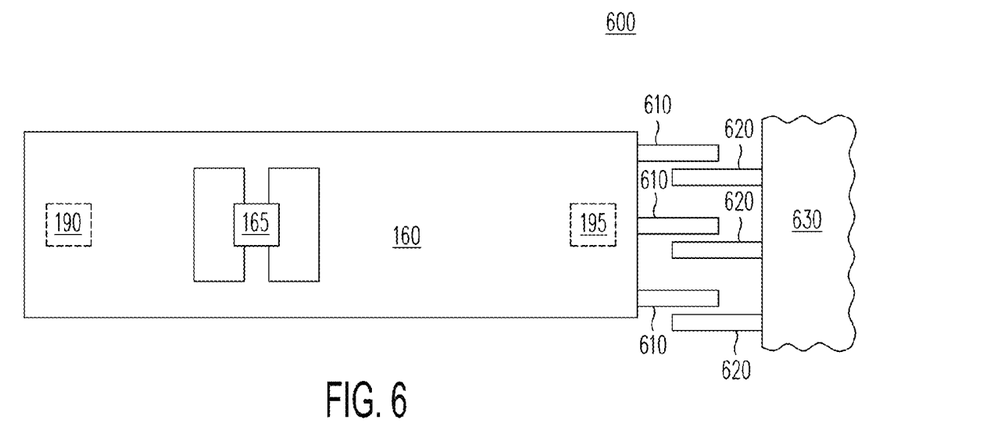
FIG. 6 is a plan view of a teeter totter accelerometer assembly 600 including an alternate means for applying an electrostatic force orthogonal to a stiction force, in accord with one embodiment of the present invention.

FIG. 6 is a plan view of a teeter totter accelerometer assembly 600 including an alternate means for applying an electrostatic force orthogonal to a stiction force, in accord with one embodiment of the present invention. The teeter totter accelerometer is fabricated using a process similar to that described above, resulting in a pivoting proof mass 160 that rotates through a pivot point 165. Travel stops 190 and 195 are illustrated as being below the rotating proof mass.

For applications in which the orthogonal force magnitude to release a stiction held pivoting proof mass 160 is sufficiently large as to make a flat orthogonal force electrode (e.g., 510) impractical, a comb electrode configuration can be used. An orthogonal force comb electrode 610 is formed on pivoting proof mass 160 in a region near travel stop 195. A set of orthogonal force comb electrodes 610 is formed such that an electrostatic force applied through the electrode will be orthogonal to a stiction force holding travel stop 195. The electrostatic force can be applied through a corresponding fixed comb electrode 620. Fixed comb electrode 620 is formed on a surface 630 in a region proximate to electrode 610. Orthogonal force comb electrode 610 and fixed comb electrode 620 are formed using techniques known in the art of MEMS fabrication (e.g., using deep reactive-ion etching techniques).

Through the use of comb electrodes, such as orthogonal force comb electrode 610 and fixed comb electrode 620, additional capacitive surface area between the electrodes can be realized over a single flat capacitive electrode in a similar region. Thus, a greater orthogonal force can be applied to the end of the pivoting proof mass through an electrostatic charge applied to the comb electrodes than for plate electrodes in the same area.

Figure 7:
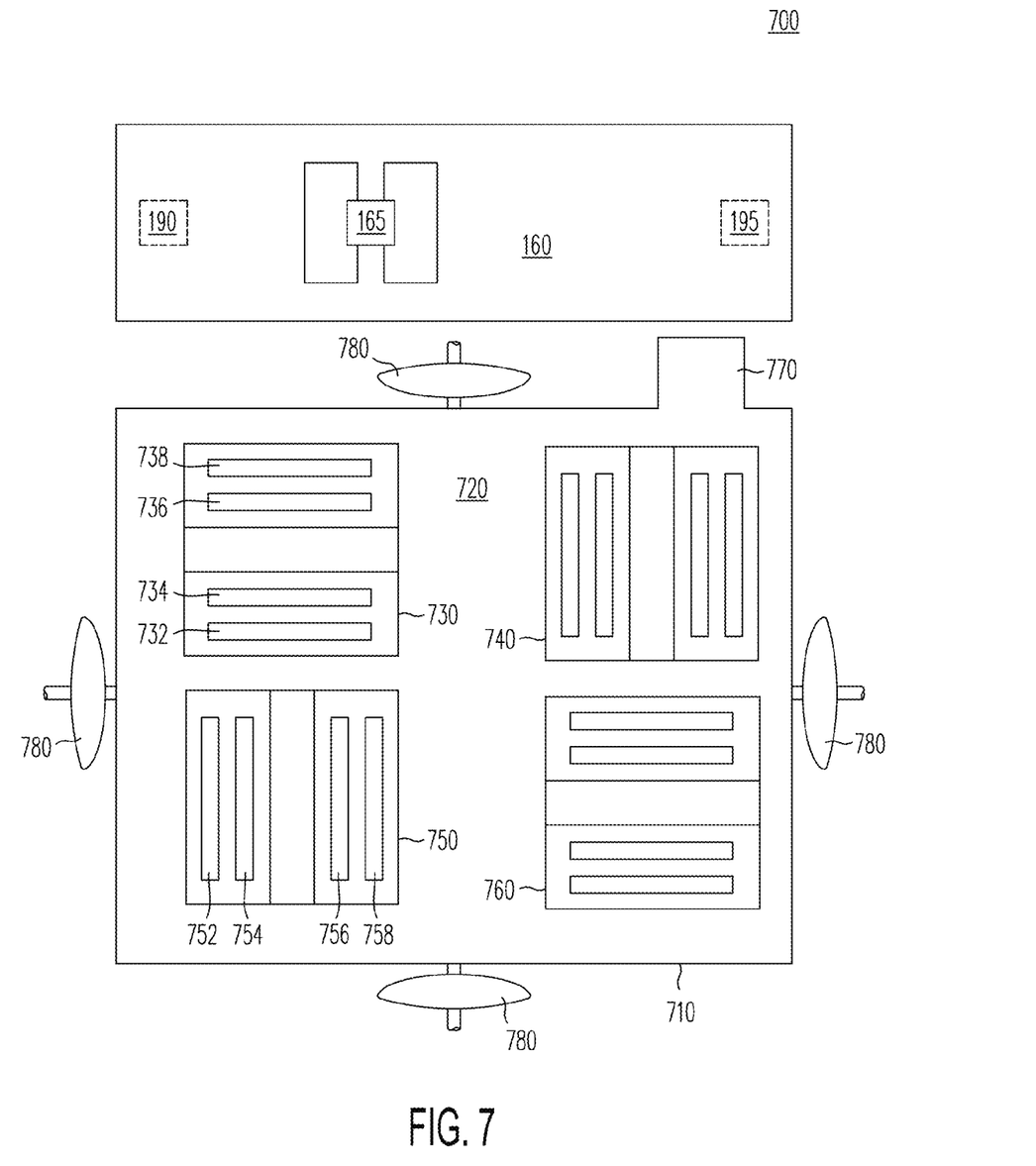
FIG. 7 is a plan view of an accelerometer assembly that includes both a teeter totter accelerometer for measuring accelerations in a Z-direction and a capacitive plate accelerometer for measuring accelerations in the XY-directions.

FIG. 7 is a plan view of an accelerometer assembly 700 that includes both a teeter totter accelerometer for measuring accelerations in a Z-direction (out of the page) and a capacitive plate accelerometer for measuring accelerations in the XY-directions (in the plane of the page), where the capacitive plate accelerometer is modified to impact the teeter totter accelerometer with an orthogonal force or impulse during a stiction event. The teeter totter accelerometer is fabricated using a process similar to that described above, resulting in a pivoting proof mass 160 that rotates through a pivot point 165. Travel stops 190 and 195 are illustrated as being below the rotating proof mass.

A typical three-axis MEMS accelerometer includes not only a teeter totter assembly for measuring accelerations in a Z-direction, but also a capacitive plate accelerometer for measuring accelerations in the XY-directions. Capacitive plate accelerometer 710 includes a proof mass 720 on which are formed four sets of capacitive plate electrode regions 730, 740, 750, and 760. The capacitive plate electrodes are oriented to detect shifts in the proof mass in both X (e.g., using fixed electrodes 752, 754, 756, and 758 along with corresponding electrodes positioned on the interior of region 750 of the proof mass [not shown]) and Y (e.g., using fixed electrodes 732, 734, 736, and 738 along with corresponding electrodes positioned on the interior of region 730 of the proof mass [not shown]) directions. The proof mass is coupled to a fixed frame by flexural elements 780 along edges of the proof mass. In alternative embodiments, movement of the proof mass is enabled by flexural elements located within the area of the proof mass. Further, while flexural elements 780 are illustrated as a leaf spring, alternatives can include structures such as cantilevers, u-shaped springs, and the like. Embodiments of the present invention are not limited to the mechanism used to enable movement of the XY-accelerometer proof mass with respect to the fixed portions of the accelerometer.

Such a combination of XY-accelerometer and Z-accelerometer in a single package is available in the art. In one embodiment of the present invention, the XY-accelerometer is modified to incorporate an impact point 770 on proof mass 710. Impact point 770 is provided in a region of accelerometer assembly 700 that is near an end of pivoting proof mass 160 (e.g., near travel stop 195). Impact point 770 is formed of a size sufficient to impact the end of the pivoting proof mass upon an application of electrostatic charge to one or more capacitive plate electrodes in capacitive plate electrode regions 730, 740, 750, and 760. An electrostatic charge would be applied to the capacitive plate electrodes during a stiction event for pivoting proof mass 160. The force applied by impact point 770 to the end of pivoting proof mass 160 is orthogonal to a stiction force generated through travel stop 195.

Figure 8:
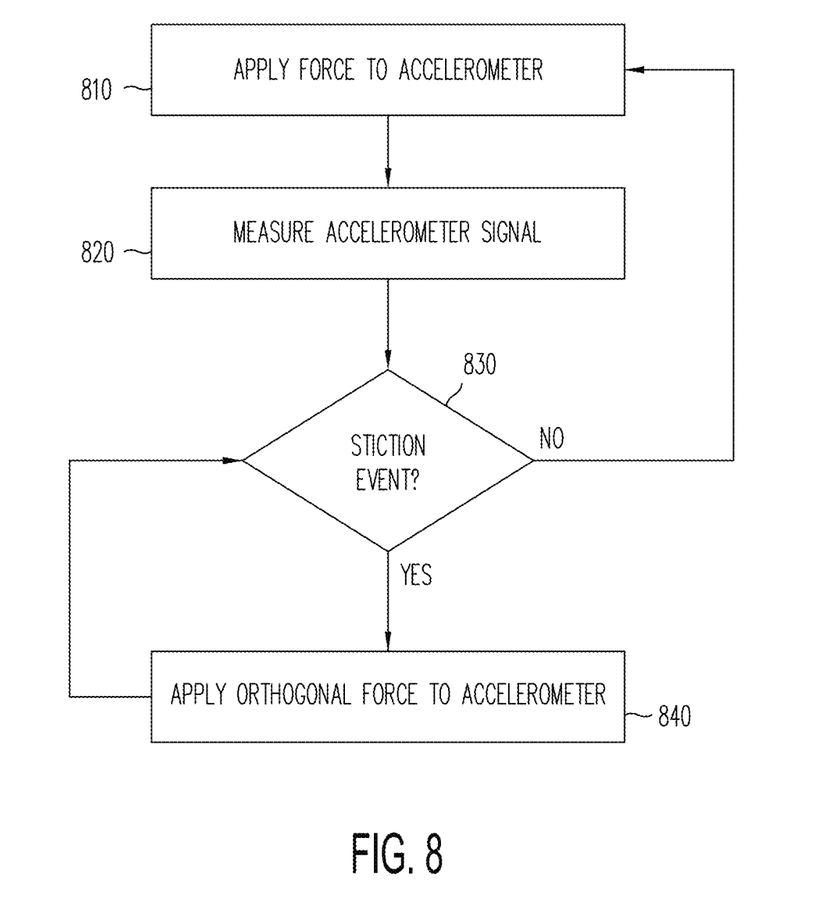
FIG. 8 is a simplified flow diagram illustrating an example of a use of an accelerometer incorporating embodiments of the present invention.

FIG. 8 is a simplified flow diagram illustrating an example of a use of an accelerometer incorporating embodiments of the present invention. During a typical operation of the accelerometer, a force is applied to the accelerometer (e.g., by moving the accelerometer or a device that includes the accelerometer) (810). During the exertion of the force, a signal is measured from the accelerometer. For example, in one type of teeter-totter accelerometer, capacitance values are measured from electrode 180 and fixed electrode 130 and/or electrode 185 and fixed electrode 135. Changes in capacitance from an at rest value are related to the force being applied to the accelerometer.

A determination can then be made if a stiction event is occurring (830). For example, if a signal from the accelerometer is equal or greater than a predetermined threshold value for the accelerometer, then a stiction event may be indicated (e.g., a maximum capacitance value between the electrodes on the pivoting proof mass and the fixed electrodes). Alternatively, a signal providing a threshold or greater value for an extended period of time could be indicative of a stiction event. If the determination is that no stiction event is occurring, then additional forces can be applied and measured by the accelerometer. If the determination is that a stiction event is occurring, then a force orthogonal to the stiction force can be applied to the accelerometer (840). Such an orthogonal force can be applied by electromagnetic or physical means by using, for example, the mechanisms described above. Once the orthogonal force is applied, a determination can be made as to whether the stiction event continues. If not, then normal operation of the accelerometer can be continued (810). If the stiction event continues, then the orthogonal force can be reapplied to the accelerometer until the stiction event is resolved (840).

One advantage of providing a mechanism for releasing stiction events in accelerometer-type MEMS devices is improved sensitivity of the device. In one type of traditional MEMS accelerometer, stiction force is countered by increasing a spring constant of the device. But increasing the spring constant decreases sensitivity of the MEMS device to light acceleration forces. In another type of traditional MEMS device, chances for stiction occurring are reduced by increasing the distance between the movable portions of the device and the fixed portions of the device. But this increases the distance between the capacitive plates and can therefore decrease differences in measured capacitance. Providing a mechanism for releasing stiction events by using embodiments of the present invention allows for lower spring constants and smaller distances between parts, both of which can improve device sensitivity.

By now it should be appreciated that a method for recovering from a stiction event in a micro-electromechanical systems device has been provided. The method includes subjecting the MEMS device to a force sufficient to cause stiction between a moving portion of the MEMS device and the fixed portion of the MEMS device, and exerting a release force to the MEMS device sufficient to release the stiction between the moving portion of the MEMS device and the fixed portion of the MEMS device. The release force includes a release force vector orthogonal to a stiction force vector associated with the stiction. Said exerting is performed by a component in a package that includes the MEMS device.

In one aspect of the above embodiment the MEMS device is a teeter-totter accelerometer and the moving portion of the MEMS device is a rotating proof mass. In a further aspect, the release force is an electromagnetic force. In still a further aspect, the component in the package that provides the electromagnetic force includes an electrode formed on a side surface of an end of the rotating proof mass and a fixed electrode formed on a fixed surface proximate to the electrode formed on the side surface of the end of the rotating proof mass. In still a further aspect, said exerting the release force includes applying a charge to the fixed electrode wherein the charges of a sufficient magnitude to cause an electromagnetic force, and the release force includes the electromagnetic force.

In another aspect of the above embodiment, the MEMS device is a teeter-totter accelerometer, the moving portion of the MEMS device is a rotating proof mass, and exerting the release force includes impacting a side surface of the rotating proof mass with a mechanical force, wherein the release force includes the mechanical force. In a further aspect, the component includes a second MEMS device located in proximity to the MEMS device. In still a further aspect, the second MEMS device includes a capacitive plate XY-accelerometer, and the capacitive plate XY-accelerometer includes an impact feature located in proximity to the MEMS device.

Another aspect of the above embodiment includes detecting the presence of the stiction event in the MEMS device, and performing said exerting the release force in response to said detecting.

Another embodiment provides a micro electromechanical systems device that includes a first proof mass subject to a stiction force between the first proof mass and the fixed portion of the MEMS device, and means for applying a release force to the first proof mass in response to the stiction force. The release force is sufficient to release the stiction force and includes a release force vector orthogonal to a stiction force vector associated with a stiction force.

In one aspect of the above embodiment, the means for applying the release force includes a means for applying an electromagnetic force. In a further aspect, the means for applying the electromagnetic force includes an electrode formed on a side surface of a portion of the first proof mass, and a fixed electrode formed on the fixed surface proximate to the electrode formed on the side surface of the portion of the first proof mass. The portion of the first proof mass includes a location in contact with the fixed portion of the MEMS device while under application of the stiction force. In still a further aspect, the fixed electrode is configured to apply a charge of a sufficient magnitude to generate an electromagnetic force with electrode on the side surface of the first proof mass, and the release force includes electromagnetic force.

In another aspect of the above embodiment, the means for applying the release force includes a means for applying a mechanical force. In a further aspect, the means for applying mechanical force includes a second MEMS device located in proximity to the first proof mass. The second MEMS device is configured to impact the first proof mass in response to the stiction force. In still a further aspect, a teeter-totter accelerometer includes the first proof mass, the first proof mass is a rotating proof mass, a capacitive plate XY-accelerometer includes the second MEMS device, and the capacitive plate XY-accelerometer includes an impact feature configured to impact the MEMS device. In yet a further aspect, the capacitive plate XY-accelerometer further includes a capacitive plate pair that is configured to move a second proof mass of the capacitive plate XY-accelerometer to impact the first proof mass in response to the stiction force. In a further aspect, the capacitive plate pair is further configured to provide capacitive signals in response to movement in an X or Y axial direction of the capacitive plate accelerometer.

Another embodiment provides a semiconductor device package that having a Z-axis accelerometer that includes a first proof mass, and further having a capacitive plate XY-axis accelerometer that includes a second proof mass. The Z-axis accelerometer is subject to a stiction force is a portion of the first proof mass contacts a fixed surface. A portion of the second proof mass is configured to impact the portion of the first proof mass in response to the stiction force. In one aspect of the above embodiment, the semiconductor device package further includes logic that is communicatively coupled to the Z-axis accelerometer and the capacitive plate XY-axis accelerometer. The logic is configured to receive a first signal from the Z-axis accelerometer, wherein the first signal indicates an occurrence of the stiction force. The logic is further configured to provide a second signal to the capacitive plate XY-axis accelerometer, in response to the first signal. The portion of the second proof mass impacts the portion of the first proof mass in response to the second signal.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the description of embodiments of the invention relates to a teeter-totter type accelerometer. Embodiments of the present invention are not limited to teeter-totter accelerometers, but can include accelerometers having a mass suspended by springs, or other MEMS devices that have a potential for components to come in contact with one another during operation or manufacture. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for recovering from a stiction event in a microelectromechanical systems (MEMS) device, the method comprising:
    subjecting the MEMS device to a force sufficient to cause stiction between a moving portion of the MEMS device and a fixed portion of the MEMS device, wherein the MEMS device comprises a teeter-totter accelerometer and the moving portion of the MEMS device is a rotating proof mass;
    exerting a release force to the MEMS device sufficient to release the stiction between the moving portion of the MEMS device and the fixed portion of the MEMS device, wherein
        the release force comprises a release force vector orthogonal to a stiction force vector associated with the stiction,
        said exerting is performed by a component in a package comprising the MEMS device, and
        the release force is an electromagnetic force.

2. The method of claim 1 wherein the component in the package comprises:
    an electrode formed on a side surface of an end of the rotating proof mass; and
    a fixed electrode formed on a fixed surface proximate to the electrode formed on the side surface of the end of the rotating proof mass.

3. The method of claim 2 wherein said exerting comprises:
    applying a charge to the fixed electrode wherein the charge is of a sufficient magnitude to cause the electromagnetic force.

4. A method for recovering from a stiction event in a microelectromechanical systems (MEMS) device, the method comprising:
    subjecting the MEMS device to a force sufficient to cause stiction between a moving portion of the MEMS device and a fixed portion of the MEMS device, wherein the MEMS device comprises a teeter-totter accelerometer and the moving portion of the MEMS device is a rotating proof mass;
    exerting a release force to the MEMS device sufficient to release the stiction between the moving portion of the MEMS device and the fixed portion of the MEMS device, wherein
        the release force comprises a release force vector orthogonal to a stiction force vector associated with the stiction, and
        said exerting is performed by a component in a package comprising the MEMS device, and
        said exerting the release force comprises impacting a side surface of the rotating proof mass with a mechanical force, wherein the release force comprises the mechanical force.

5. The method of claim 4, wherein the component comprises a second MEMS device located in proximity to the MEMS device.

6. The method of claim 5, wherein
    the second MEMS device comprises a capacitive plate XY-accelerometer, and
    the capacitive plate XY-accelerometer comprises an impact feature located in proximity to the MEMS device.

7. The method of claim 1 further comprising:
    detecting the presence of the stiction event in the MEMS device; and
    performing said exerting the release force in response to said detecting.

8. A microelectromechanical systems (MEMS) device comprising:
    a first proof mass subject to a stiction force between the first proof mass and a fixed portion of the MEMS device;
    means for applying a release force to the first proof mass in response to the stiction force, wherein
        the release force is sufficient to release the stiction force, and
        the release force comprises a release force vector orthogonal to a stiction force vector associated with the stiction force, and
        the means for applying the release force comprises a means for applying an electromagnetic force.

9. The MEMS device of claim 8 wherein the means for applying the electromagnetic force comprises:
    an electrode formed on a side surface of a portion of the first proof mass; and
    a fixed electrode formed on a fixed surface proximate to the electrode formed on the side surface of the portion of the first proof mass, wherein
        the portion of the first proof mass comprises a location in contact with the fixed portion of the MEMS device while under application of the stiction force.

10. The MEMS device of claim 9, wherein
    the fixed electrode is configured for applying a charge of a sufficient magnitude to generate the electromagnetic force with the electrode on the side surface of the first proof mass.

11. A microelectromechanical systems (MEMS) device comprising:
    a first proof mass subject to a stiction force between the first proof mass and a fixed portion of the MEMS device;
    means for applying a release force to the first proof mass in response to the stiction force, wherein
        the release force is sufficient to release the stiction force, and
        the release force comprises a release force vector orthogonal to a stiction force vector associated with the stiction force, and
        the means for applying the release force comprises a means for applying a mechanical force.

12. The MEMS device of claim 11 wherein the means for applying the mechanical force comprises:
    a second MEMS device located in proximity to the first proof mass, wherein the second MEMS device is configured to impact the first proof mass in response to the stiction force.

13. The MEMS device of claim 12, wherein
    a teeter-totter accelerometer comprises the first proof mass,
    the first proof mass is a rotating proof mass,
    a capacitive plate XY-accelerometer comprises the second MEMS device, and
    the capacitive plate XY-accelerometer comprises an impact feature configured to impact the MEMS device.

14. The MEMS device of claim 13 wherein the capacitive plate XY-accelerometer further comprises:
    a capacitive plate pair configured to move a second proof mass of the capacitive plate XY-accelerometer to impact the first proof mass in response to the stiction force.

15. The MEMS device of claim 14 wherein the capacitive plate pair is further configured to provide capacitance signals in response to movement in an X or Y axial direction of the capacitive plate XY-accelerometer.

16. A semiconductor device package comprising:
   a Z-axis accelerometer comprising a first proof mass, wherein
      the Z-axis accelerometer is subject to a stiction force when a portion of the first proof mass contacts a fixed surface; and
   a capacitive plate XY-axis accelerometer comprising a second proof mass, wherein
      a portion of the second proof mass is configured to impact the portion of the first proof mass in response to the stiction force.

17. The semiconductor device package of claim 16 further comprising:
   logic, communicatively coupled to the Z-axis accelerometer and the capacitive plate XY-axis accelerometer, configured to
      receive a first signal from the Z-axis accelerometer, wherein the first signal indicates an occurrence of the stiction force,
      provide a second signal to the capacitive plate XY-axis accelerometer, in response to the first signal, wherein the portion of the second proof mass impacts the portion of the first proof mass in response to the second signal.

* * * * *